(12) United States Patent
Piernot et al.

(10) Patent No.: US 6,417,663 B1
(45) Date of Patent: Jul. 9, 2002

(54) DETECTING PHYSICAL OBJECTS STATES USING ELECTROMAGNETIC SENSORS

(75) Inventors: Philippe P. Piernot; Marcos R. Vescovi, both of Palo Alto; Justin Willow; Robin Petravoc, both of San Francisco, all of CA (US)

(73) Assignee: Interval Research Corporation, Palo Alto, CA (US)

( * ) Notice: Subject to any disclaimer, the term of this patent is extended or adjusted under 35 U.S.C. 154(b) by 0 days.

(21) Appl. No.: 09/144,951

(22) Filed: Sep. 1, 1998

(51) Int. Cl.⁷ .............................. G01B 7/14; G01R 27/00
(52) U.S. Cl. ...................... 324/207.17; 324/652; 463/1; 273/237
(58) Field of Search ............................ 324/652, 207.17; 702/150; 273/237; 463/1; 340/568.1

(56) References Cited

U.S. PATENT DOCUMENTS

| | | | |
|---|---|---|---|
| 4,341,385 A | 7/1982 | Doyle et al. | 463/10 |
| 5,082,286 A | 1/1992 | Ryan et al. | 273/238 |
| 5,088,928 A | 2/1992 | Chan | 434/339 |
| 5,188,368 A | 2/1993 | Ryan | 273/237 |
| 5,330,380 A | 7/1994 | McDarren et al. | 446/397 |
| 5,694,045 A | * 12/1997 | Ikeda et al. | 324/652 |

FOREIGN PATENT DOCUMENTS

| | | |
|---|---|---|
| DE | 3813779 A1 | 11/1989 |
| DE | 4207534 | 9/1993 |
| EP | 0606790 A2 | 7/1994 |
| EP | 0701848 | 3/1996 |
| FR | 2607400 | 6/1988 |
| GB | 2103943 A | 3/1983 |
| GB | 2237514 A | 5/1991 |
| JP | 05177056 | 7/1993 |
| SE | 7812190 | 5/1980 |
| WO | WO95/31696 | 11/1995 |
| WO | WO9603188 | 2/1996 |
| WO | WO97/19323 | 5/1997 |

* cited by examiner

Primary Examiner—Jay Patidar
(74) Attorney, Agent, or Firm—Van Pelt & Yi LLP

(57) ABSTRACT

Disclosed is a position detection system for determining a state of a physical object. The position detection system includes a platform and a physical object positioned adjacent to the platform. The physical object has an object state that is changeable. The position detection system also includes a first resonator having a first resonator position state. The first resonator is arranged such that a change in the object state causes a change in the first resonator position state and such that the first resonator position state is different from the object state. The first resonator is further arranged to output a resonator signal that is associated with the first resonator position state when an excitation signal with a predetermined frequency range is received by the first resonator. The position detection system further includes a translation mechanism for translating the object state into the first resonator position state and a computer system arranged to output an excitation signal at the predetermined frequency range to the first resonator and receive the first resonator position state that is associated with the resonator signal that is output from the first resonator in response to the predetermined frequency range.

23 Claims, 15 Drawing Sheets

DETECTING PHYSICAL OBJECTS STATES USING ELECTROMAGNETIC SENSORS

CROSS REFERENCE TO RELATED APPLICATIONS

This application is related to U.S. patent application Ser. No. 09/018,023 filed Feb. 2, 1998 entitled "Computer Method and Apparatus for Interacting with a Physical System" by Piernot, et al., having assignment rights in common with the present invention and which is herein incorporated by reference.

BACKGROUND OF THE INVENTION

This invention relates generally to a position detection system and computer methods for detecting physical objects within such position detection system. More specifically, it is related to a computer system that is implemented to detect physical objects within a physical game board or a physical toy for the purpose of interfacing with such computer system.

With the prevalence of home computers, an increasingly important goal within the game industry is to design a game system that incorporates the advantages of traditional board games and advantages of video or computer games. Such combined board game systems should generally be capable of detecting the presence of playing pieces or physical objects at different locations on the game board. Preferably, they should also identify other attributes, besides position, of the physical pieces.

Various type of computer games that interface with physical objects are described in British Patent Application Number PCT/US95/10096 filed by Superdimension Inc, published on Feb. 8, 1996 (Herein referred to as "Superdimension). For example, Superdimension refers to British Patent 2,103,943 as describing a sensing board and resonating pieces. The pieces include resonators that may be sensed by circuits in the board associated with particular position "cells." The resonators are sensed by electromagnetic induction. Due to coupling between the coils in the playing pieces and the coils in the board, signals fed to the board stimulate the resonators and pick up a resonant signal that is produced by the resonators. Since different pieces have different resonators that are stimulated at different resonant frequencies, different pieces may be identified based on the frequency of the resonant signal that is picked up in a particular cell on the board.

The board incorporates two groups of circuits, each group having a circuit associated with each cell. One group of cells stimulates the resonators in any pieces on the cells by transmitting electromagnetic signals and the other group receives signals produced by the resonators in the cells in response to the stimulation. The coils in each group are interconnected and are individually addressable via a diode associated with each coil.

To determine the position of a particular piece on a cell, a pulse of electric current is supplied to the simulating coil of the cell, whereby a rapid change in current at the trailing end of the pulse results in oscillation of the resonator in the piece situated at the cell at its resonant frequency. The resonant oscillation induces a current signal in the sensing coil associated with the cell which signal is amplified and thresholded. For signals greater than the threshold, the oscillation frequency is measured to yield a corresponding digital signal. When a cell is empty, i.e. it does not accommodate a piece, there is no resonant "ringing" and, therefore, the number of transitions is detectably low. In sum, this game system can only sense a position and a frequency dependent identity of the game piece.

Superdimension further describes other patents describing position sensing boards, some of which are capable of differentiating between different playing pieces, based on their individual resonating frequencies. Sensing of positional attributes of playing pieces and reacting accordingly is also performed in pinball machines, which sense the position of the pinball using a remote sensor. A ski-game, disclosed in patent SU 844011, uses photocells to detect whether ski-figure playing pieces are correctly located on a ski track and keeps score.

U.S. Pat. No. 5,169,516 discloses an interactive action toy system, in which two toy figures react to each other based on a sensed engagement position for both toys. SE 7812190, U.S. Pat. No. 4,341,385, GB 2237514, and U.S. Pat. No. 5,088,928 disclose computer games wherein a computer reacts to the position and/or previous position of a playing piece on a physical board by playing sounds and/or video graphics.

Although the above described game systems provide adequate game piece interaction for the user, these games only provide a limited number of ways to manipulate pieces, wherein the manipulation is detected by the position sensors. That is, these games only allow the user to select a type of piece and a position of the selected piece. For example, some sensing systems are incapable of detecting certain other object states, such as a z position of the game piece. Thus, the user may only move the piece within a two dimensional plane.

Additionally, since conventional game systems identify pieces based on their resonating frequency, the number of game pieces is necessarily limited by the number of resonating frequencies that are allowed by the particular sensing technology. For example, if a position sensing system only allows 64 different resonant frequencies, the game is limited to 64 types of pieces.

Thus, there is a need for an improved game system and a method for detecting a wide range of object states of physical objects within a position detection system. Additionally, there is a need to reduce the number of resonators that are required for detecting a large number of objects or a wide range of object states.

SUMMARY OF THE INVENTION

To achieve the foregoing and other objects and according to the purpose of the present invention, a method and apparatus for determining an object state of a physical object within a position detection system is disclosed. In general, the present invention provides mechanisms for converting the object state of the physical object into a corresponding resonator position state, wherein the object state differs from the resonator position state. The position state of the resonator may be detected and used to determine the object state of the physical object by translating the detected resonator state back into the associated object state. For example, a translation mechanism may be configured to convert a z position state of the physical object into an x position state of an associated resonator, and the x position state of the resonator may then be detected and used to determine the z position state of the physical object. Several other mechanisms for determining an object state from a different detected resonator state are further described below.

In one embodiment, a position detection system for determining a state of a physical object is disclosed. The position detection system includes a platform and a physical object positioned adjacent to the platform. The physical object has an object state that is changeable. The position detection system also includes a first resonator having a first resonator position state. The first resonator is arranged such that a change in the object state causes a change in the first resonator position state and such that the first resonator position state is different from the object state. The first resonator is further arranged to output a resonator signal that is associated with the first resonator position state when an excitation signal with a predetermined frequency range is received by the first resonator. The position detection system further includes a translation mechanism for translating the object state into the first resonator position state and a computer system arranged to output an excitation signal at the predetermined frequency range to the first resonator and receive the first resonator position state that is associated with the resonator signal that is output from the first resonator in response to the predetermined frequency range.

In one aspect of the invention, the platform is interchangeable and includes a second resonator having a second resonator position state, and the computer system is further arranged to receive the second resonator position state and determine a platform identity based on the second resonator position state. Additionally, the computer system may be further arranged to determine the object state by translating the first resonator position state into the object state.

A method of determining an object state of a physical object within a position detection system is also disclosed. The position detection system also includes a resonator having a resonator state that depends on the object state, and the resonator state is different from the resonator state. An excitation signal is sent with a frequency range to the resonator of the detection system. A position signal is received from the resonator. The position signal is based on the resonator state. The position state associated with the received position signal is translated into the object state.

These and other features and advantages of the present invention will be presented in more detail in the following specification of the invention and the accompanying figures which illustrate by way of example the principles of the invention.

DETAILED DESCRIPTION OF THE SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
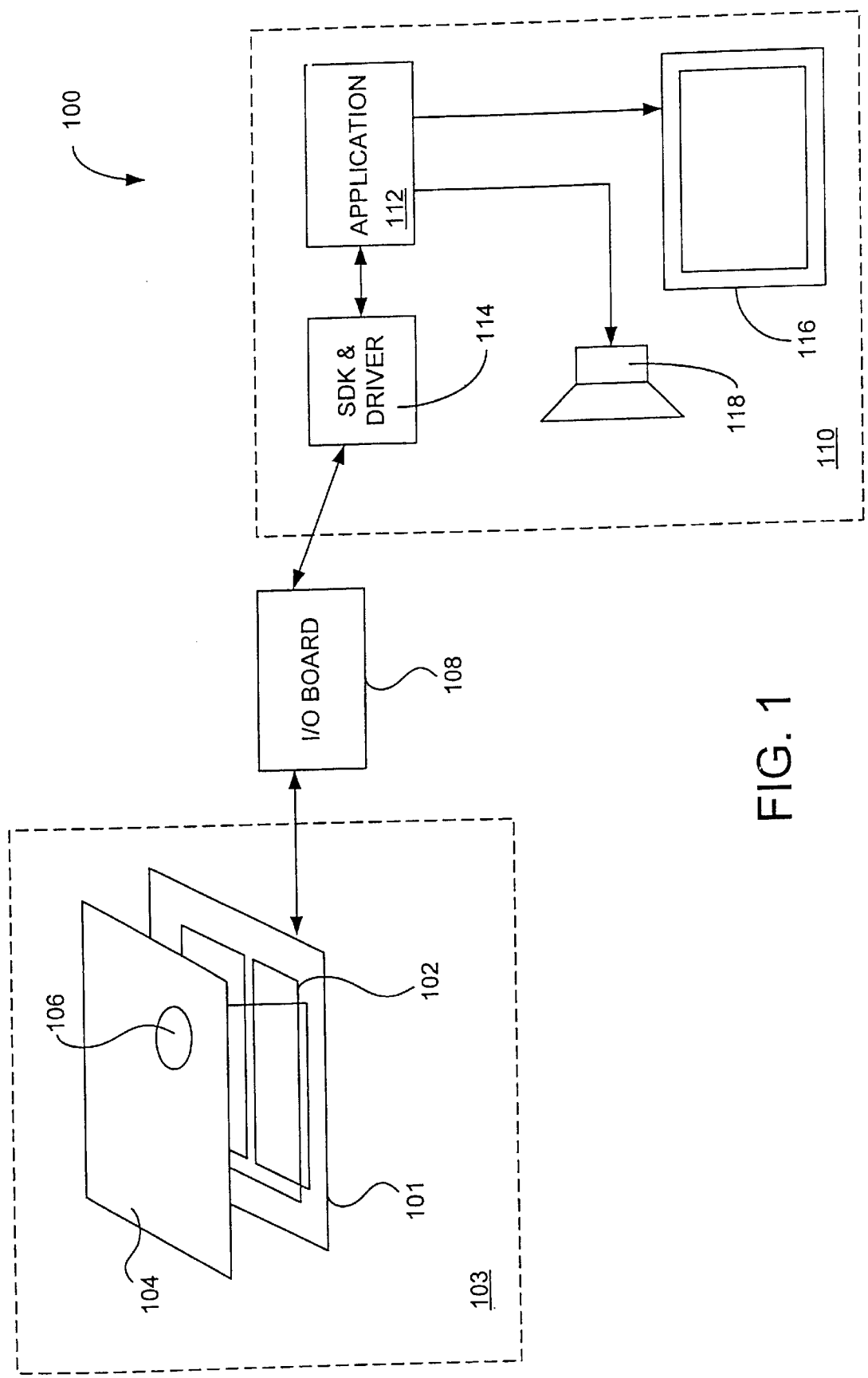
FIG. 1 shows a position detection system in accordance with one embodiment of the present invention.

FIG. 1 shows a position detection system 100 in accordance with one embodiment of the present invention. The detection system includes a physical game unit 103, a computer system 110, and an I/O board 108 for interfacing between the physical game unit 103 and computer 110. Although the computer 110 is shown as being a separate component from the physical game unit 103, of course, the computer 110 may be integrated with the physical game unit 103. As shown, the physical game unit 103 includes a board 101 having an antenna 102, a game platform 104, and a physical object 106 having an associated resonator (not shown) and an associated translation mechanism (not shown). The computer 110 includes a software development kit (SDK) and driver 114, application program 112, display 116, and speakers 118.

SDK 114 controls I/O board 108, and data from I/O board 108 is transferred to application program 112. In one embodiment, Macromedia Director® is used to program and translate commands which are interpreted by SDK 114. One skilled in the art will recognize that other commercially available programs could also be used to define and translate commands. Application program 112 written in Macromedia Director makes calls to SDK 114, which makes calls to driver 114, which accesses the I/O board 108. These commands control how an excitation signal is sent by the I/O board 108 to antenna 102.

The translation mechanism of the physical object 106 is arranged to translate one or more object state(s) of the physical object into one or more position state(s) of the resonator. In other words, when one of the object states of the physical object is changed, the corresponding position state of the resonator is also changed. Thus, one or more of the resonator position states are related to one or more object states. Several embodiments of translation mechanisms are described further below in reference to FIGS. 4 through 17C.

The resonator of the physical object 106 resonates at a particular resonating frequency, and the excitation signal that is transmitted to the antenna has a particular frequency. Antenna 102 receives a detected signal from the resonator when the resonator "rings" at the particular frequency of the excitation signal. In other words, the detected signal is tied to the resonator's response to the excitation signal.

The detected signal includes positional data regarding the resonator. That is, one or more of the resonator's position state may be ascertained by analyzing the detected signal. Preferably, the positional data includes six degrees of position states: x, y, and z position, rotational angle, tilt, and yaw. One example of an electromagnetic sensing system that senses six degrees of positional data is described in International PCT Application Number PCT/GB96/02896 published on May 29 1997 by Applicant Andrew Dames, et al, which is herein incorporated by reference in its entirety.

The detected signal is sent through the I/O board 108 to the driver 114, passes through SDK 114 and to application program 112. Positional data is determined based on the detected signal, and the positional data is processed and used to generate an audiovisual program that is based on the positional data. Examples of methods for generating audiovisual programs based on positional data are described further in U.S. patent application Ser. No. 09/018,023 filed Feb. 2, 1998 entitled "Computer Method and Apparatus for Interacting with a Physical System" by Piernot, et al.

Figure 2:
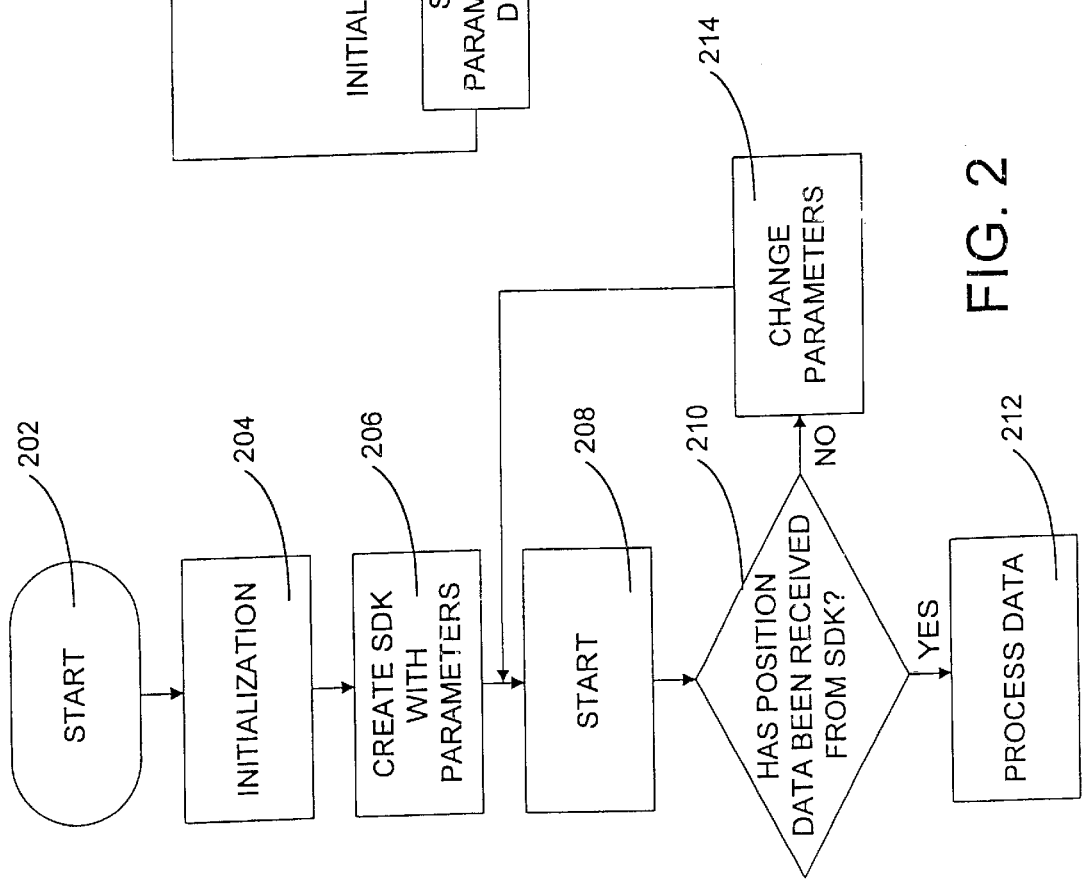
FIG. 2 conceptually illustrates the software operating in Macromedia Director portion of the application program of FIG. 1 in accordance with one embodiment of the present invention.

FIG. 2 conceptually illustrates the software operating in Macromedia Director portion of application program 300 in accordance with one embodiment of the present invention. The process begins at 202 and in a operation 204, Macromedia Director is initialized. SDK 114 is initialized with parameters in operation 206. The parameters may include frequency of the excitation signal, as well as interpretation criteria for the detected signal. Operation 208 starts the SDK 114. Once the SDK is started, operation 210 checks whether positional data has been received. If no positional data has been received, then new SDK parameters may be generated in operation 214. If positional data has been received from SDK 114, then the positional data is processed in operation 212.

Figure 3:
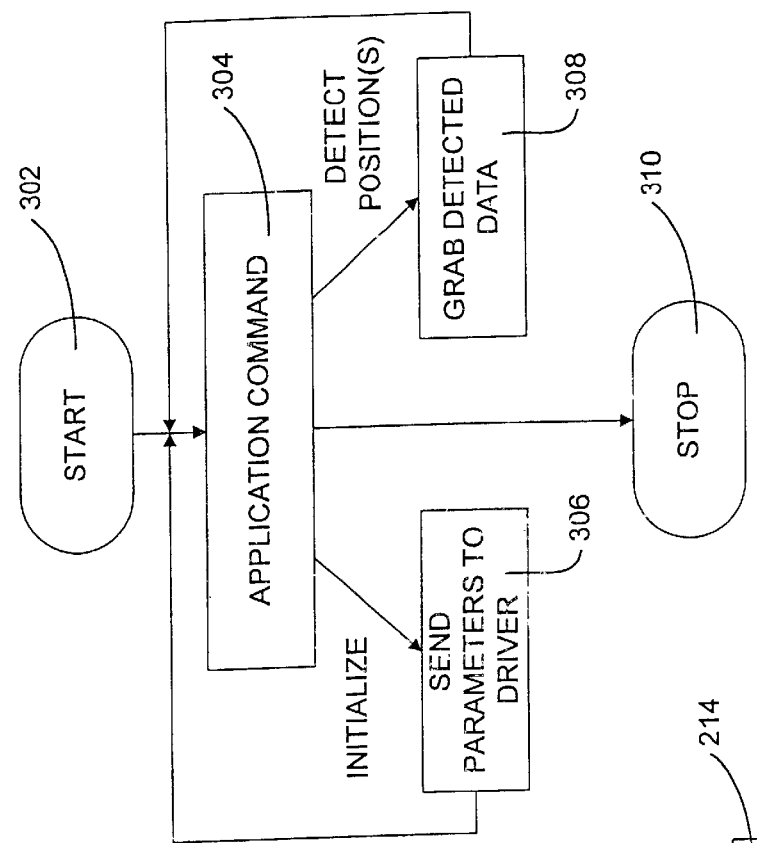
FIG. 3 illustrates the operation of the SDK of FIG. 1 in accordance with one embodiment of the present invention.

FIG. 3 illustrates the operation of SDK 114 in accordance with one embodiment of the present invention. The process begins at operation 302. In operation 304, an application command is received. If the command is to initialize, control is transferred to operation 306 and parameters are sent to the driver. In one embodiment, the driver is used with Data Acquisition Card from National Instruments. It will be apparent to one of ordinary skill in the art that other drivers can be used as well. If the application command is to start detecting, control is transferred to operation 308 which starts and controls the detection function. Once the detection function is complete, control is again transferred back to operation 304, and the cycle continues until a stop command is received and the process is terminated at 310.

As described above, the present invention includes a translation mechanism that converts an object state of the physical object to a resonator position state of an associated resonator. Techniques for detecting a position of a resonator on the game platform 104 are initiated by the computer system 110. The detected position data from the resonator may then be used to determine various object states, such as position of the physical object that are associated with the resonator. The detected position data may also be used to determine other object states of the physical object, such as weight, identity, and shape orientation. In other words, the detected position data may be utilized to determine an object state other than position. Several mechanisms for translating an object state into resonator position state and methods for determining the object state are described below in reference to FIGS. 4 through 17C.

In one embodiment, the game platform (e.g., 104 of FIG. 1) is interchangeable, and the same antenna may be used with multiple boards. Additionally, each platform may be identified by a position of an embedded resonator with respect to the platform. A particular resonator is associated with platform identification, and each platform includes this resonator. That is, the particular resonator has a predetermined frequency range that is only used to identify platform type. The particular resonator is positioned at different locations within or upon each different board platform such that the platform type may be determined by detecting a position of the resonator of the platform. Thus, resonator position is translated into a platform identification.

In another embodiment, the resonator and physical object may be positioned such that a change in one degree of freedom for the physical object results in a change in another degree of freedom for the resonator. For example, changing a z position of the physical object results in a corresponding x position change of the associated resonator. By way of another example, changing the rotation of the physical object results in a y position change of the associated resonator. By way of another example, changing a shape of the physical object results in an x position change of the associated resonator.

Figure 4:
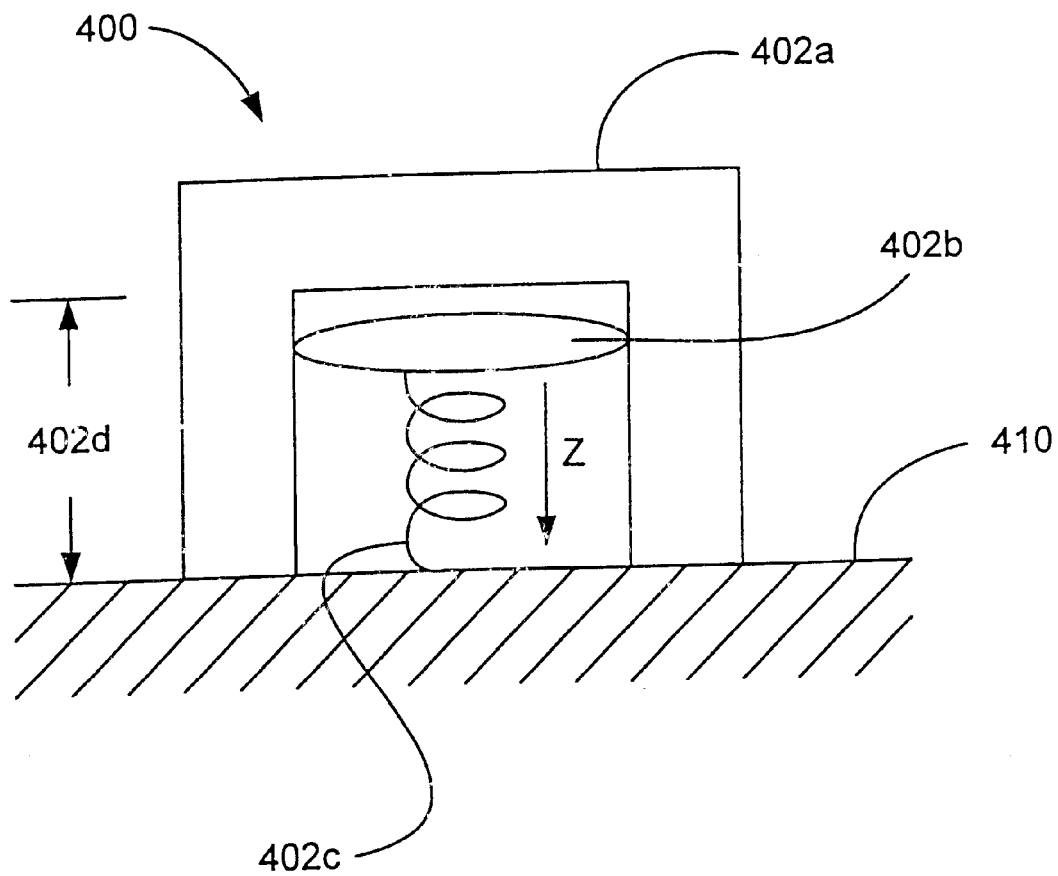
FIG. 4 is a diagrammatic side view of a physical object and associated resonator that may be used to determine an identity of the physical object in accordance with one embodiment of the present invention.

FIG. 4 is a diagrammatic side view of a physical object 402a and associated resonator 402b that may be used to determine an identity of the physical object 402a in accordance with one embodiment of the present invention. The resonator may be arranged in any suitable configuration such that when a physical object having a particular shape is placed over or adjacent to the associated resonator, the resonator moves in a particular way that depends on the shape of the physical object. For example, the shape of the physical object causes the associated resonator to move to a predetermined z position. This predetermined z position may then be detected and used to determine the physical object's identity. In other words, the physical object may be identified by its shape.

As shown, the associated resonator is mounted on a spring 402c that is affixed to the game platform 410. In this embodiment, different physical objects have different sized cavities (e.g., 402d) that are configured to compress the spring by a predetermined z distance) when the physical object is placed on top of the resonator. If the cavity sizes of the physical objects are known, the identity of the physical object (e.g., 402a) that is positioned over the resonator 402d may be determined by measuring the position of the resonator 402b and detecting how far the spring 402c has moved in the z direction. The detected z position may then be matched with a known cavity size and physical object identity.

The present invention allows efficient use of a limited number of resonators. That is, one resonator frequency may be used to identify several different physical objects. The physical object has a shape that causes the associated resonator to move by a predetermined amount which amount corresponds to the physical object's identity. In other words, the physical object's shape is utilized to identify the physical object, as compared to conventional detection systems that utilize different resonators to identify different physical objects.

Alternatively, more than one resonator may be used to identify one physical object. When a physical object having a particular shape is engaged with the resonators, some of the resonators move a predetermined amount. The movement or nonmovement may form a code (e.g., a binary code) that identifies the particular physical object. This configuration provides for a higher number of identities than the single resonator configuration (e.g., FIG. 4), while still using a relatively small number of resonators. Preferably, the degree of movement may form a nonbinary code that identifies the particular object. This configuration allows a higher number of identities than the binary code with the same number of resonators.

Figure 5A:
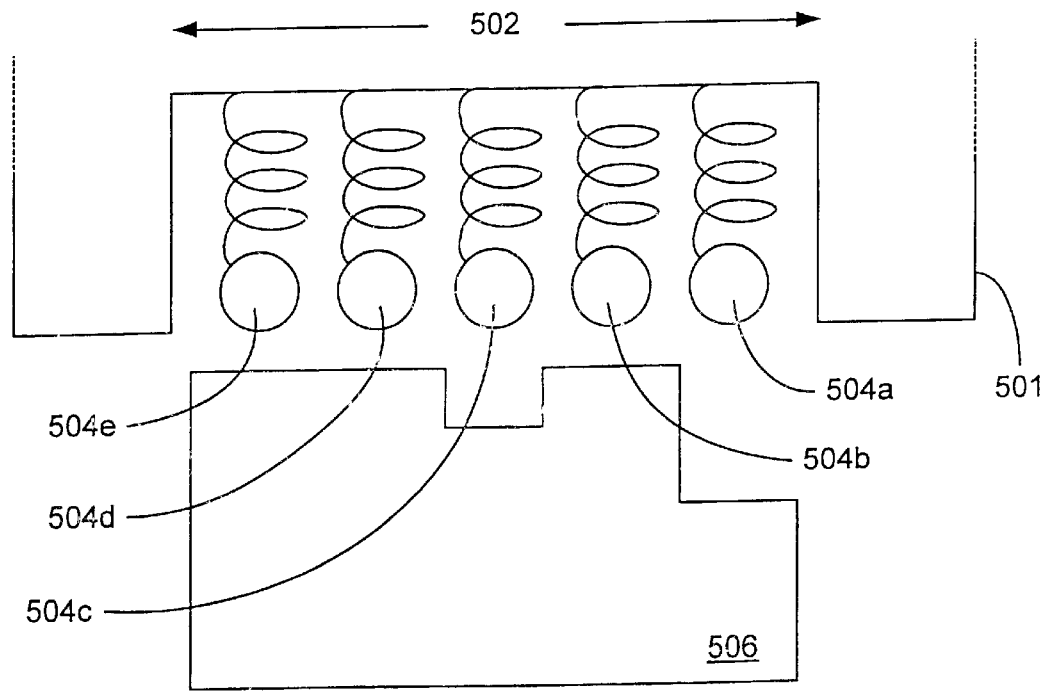
FIG. 5A is a diagrammatic top view of a physical object and a plurality of resonators that may be used to determine a coded identity of the physical object in accordance with one embodiment of the present invention.

FIG. 5A is a diagrammatic top view of a physical object 506 and a plurality of resonators 504 that may be used to determine a coded identity of the physical object 506 in accordance with one embodiment of the present invention. As shown, a plurality of resonators 504 are mounted on associated springs that are attached within a slot 502 of structure 501. The slot 502 is configured to receive a physical object (e.g., 506). When a particular physical object (e.g., 506) is inserted into the slot 502, one or more of the resonators move depending on a shape of the particular physical object. For example, when the physical object 506 is inserted, resonators 504a remains at the same position, while resonators 504b through 504e are moved by the physical object. Additionally, the resonator 504c is moved for a smaller distance than the resonators 504b, 504d, and 504e. The relative positions of the resonators may then be used to determine the identity of the physical object 506.

Figure 5B:
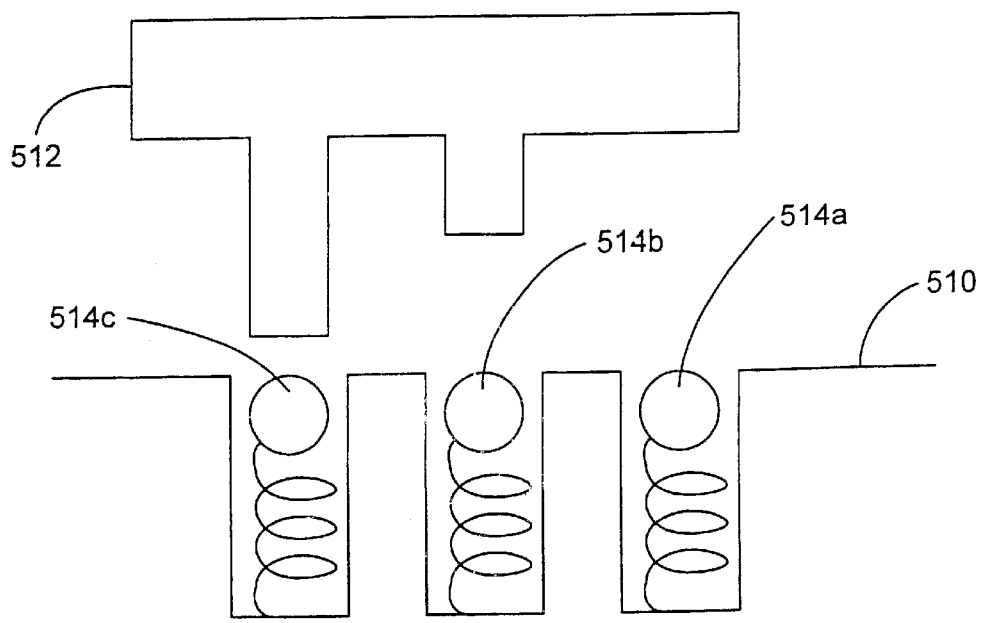
FIG. 5B is a diagrammatic side view of a pegboard type mechanism for detecting identity in accordance with one embodiment of the present invention.

Alternatively, FIG. 5B is a diagrammatic side view of a pegboard type configuration for detecting identity in accordance with one embodiment of the present invention. As shown, a physical object 512 is configured to have peg legs with varying lengths that fit into peg holes of a game platform 510. A resonator 514 is coupled with a spring that is positioned within each peg hole. The varying leg lengths cause some of the associated resonators to move a predetermined distance when the physical object is inserted into the peg holes. The relative movement of the resonators may then be detected and used to determine the identity of the physical object.

Figure 6A:
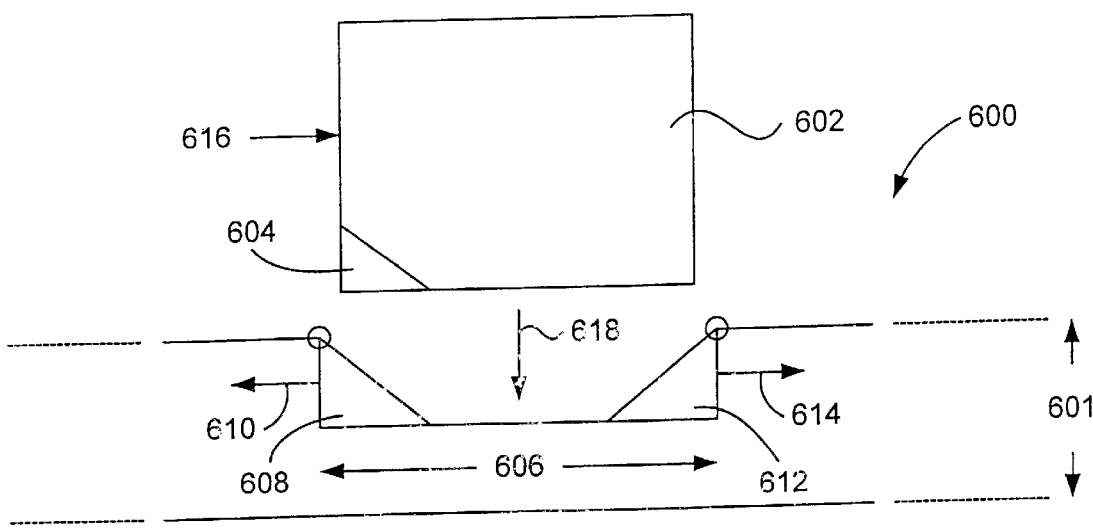
FIG. 6A is a diagrammatic side view of a door bolt type configuration for detecting an identity of a physical object in accordance with one embodiment of the present invention.

Although the present invention has been described as implementing resonators that move in a same direction as the physical object (e.g., the physical object is inserted horizontally into a slot, and resonator(s) move horizontally), of course, the resonators may also be configured to move in a different direction from the physical object. In other words, any mechanism for biasing the resonators against a physical object may be implemented. For example, FIG. 6A is a diagrammatic side view of a door bolt type configuration 600 for detecting an identity of a physical object 602 in accordance with one embodiment of the present invention.

Figures 6B, 6C:
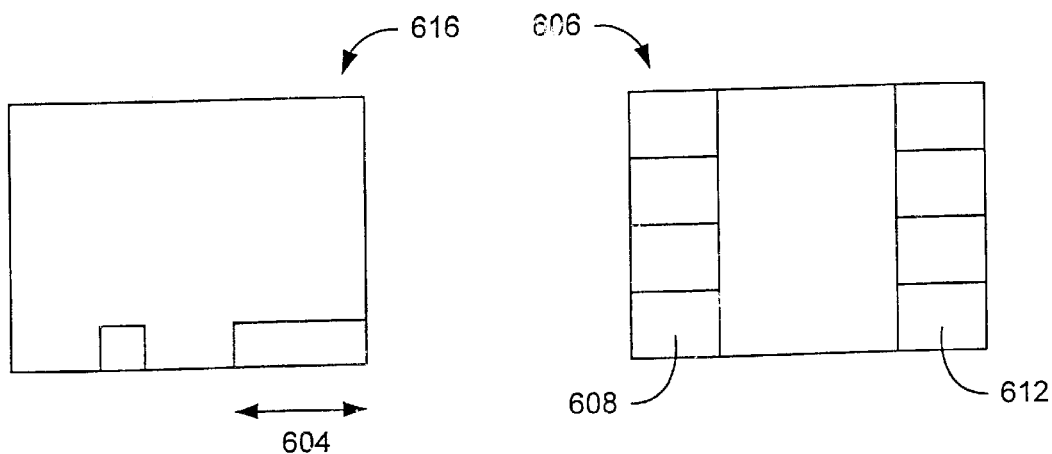
FIG. 6B is a diagrammatic side view of the physical object of FIG. 6A in accordance with one embodiment of the present invention.
FIG. 6C is a top view of the slot of FIG. 6A in accordance with one embodiment of the present invention.

As shown, the door bolt configuration 600 includes a game platform 601 having a slot 606 for receiving a physical object (e.g., 602). The slot 606 includes one or more door bolts (e.g., 508 and 612) that are configured as part of a cam shaft, rotary, and/or spring loaded mechanism such that when a physical object is inserted into the slot (e.g., in direction 618), some of the door bolts are pushed in a horizontal direction (e.g., direction 610 or 614). As shown, when physical object 602 having a cutaway portion 604 is inserted into slot 606, the door bolt 612 is pushed aside in direction 614, while door bolt 608 remains in place. FIG. 6B is a diagrammatic side view of side 616 and cutaway portion 694 of the physical object 602 of FIG. 6A. FIG. 6C is a top view of the slot 606 of FIG. 6A. As shown, a plurality of door bolts (e.g., 608 and 612) line two sides of the slot 606. However, the slot may include any number and configuration of door bolts.

In another embodiment, a resonator is configured to provide positional data for more than one physical object. In other words, a first degree of freedom (e.g., rotation) of the resonator is used to determined a corresponding rotation of a first physical object, and a second and a third degree of freedom (e.g., x and y position) of the resonator are used to determine a corresponding x and y positions of a second object. The basic idea is to form a first link between the desired degrees of freedom of the first physical object and associated degrees of freedom of the resonator and a second similar link between the second physical object and other degrees of freedom of the same resonator. Most importantly, the first link should be configured to not interfere with the second link.

Figure 7A:
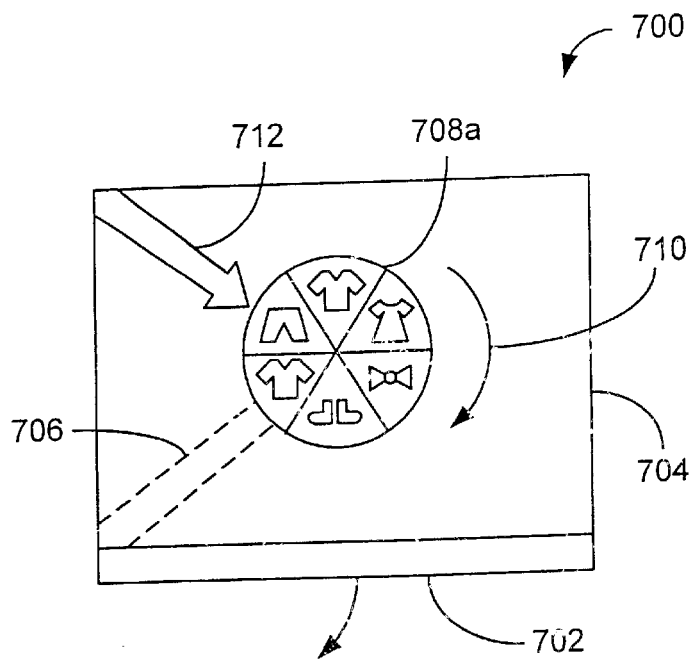
FIG. 7A is a top view of a toy closet in accordance with one embodiment of the present invention.
Figure 7B:
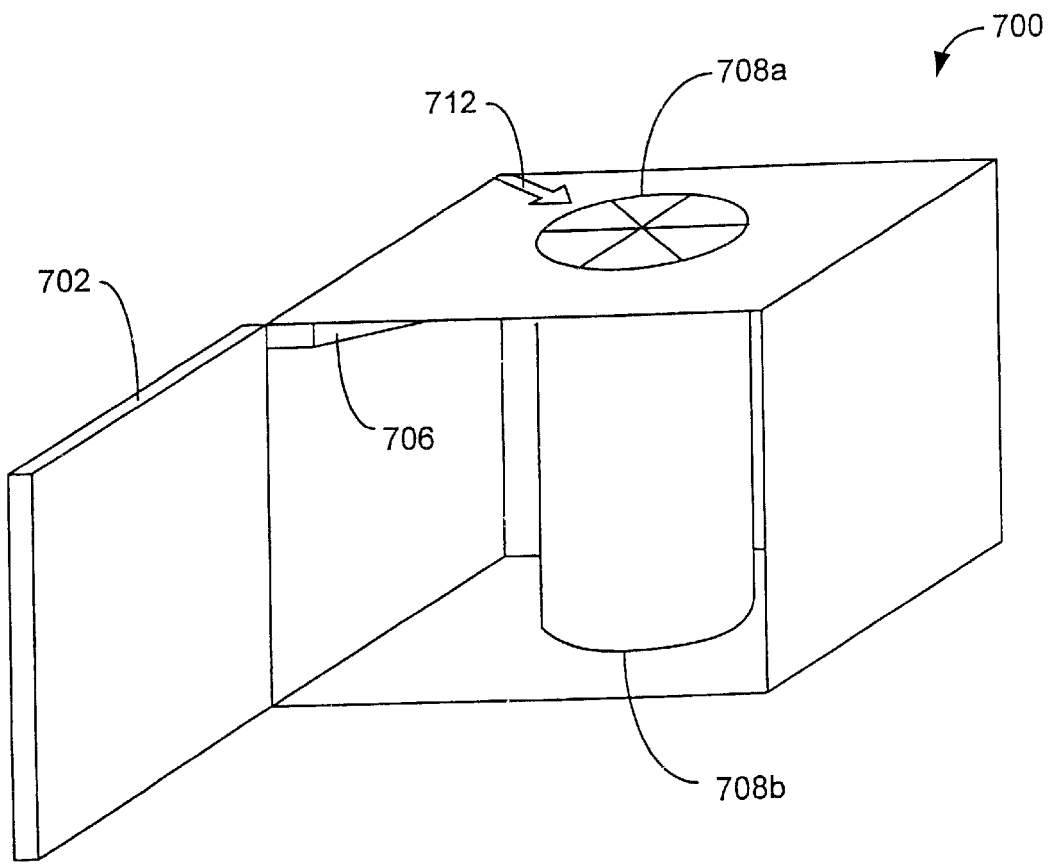
FIG. 7B is a side view perspective of the closet of FIG. 7A in accordance with one embodiment of the present invention.

FIG. 7A is a top view of a toy closet 700, and FIG. 7B is a side view perspective of the closet 700 in accordance with one embodiment of the present invention. The toy closet 700 includes a door 702 that may be opened or closed by the user. The toy closet also includes a knob 708a that is rotatably configured such that the user may turn it. For example, the user may choose clothing by positioning the knob 708 relative to an indicator 712.

A resonator 708b is coupled with the knob, for example, at the bottom of the closet 700 (see FIG. 7B). When the user turns the knob in direction 710, the resonator is correspondingly rotated. The resonator 708b is also coupled with the door 702 through arm 706. When the user opens and closes the door 702, the arm 706 and, as a result, the resonator moves in the x and y directions. Thus, two different states of the closet 700 may be determined by obtaining different positional data from the resonator 708b. That is, it may be determined whether the door is open or closed (or how much the door is opened) by detecting an x and y position of the resonator 708b. The rotation of the knob 708a with respect to the indicator 712 may be determined by detecting the rotation of the resonator 708b.

In yet another embodiment, a physical object's position is fixed with respect to a first one of the degrees of freedom. The physical object includes a movable object that is movable within this first degree of freedom. The movable object is associated with a resonator and may be used to identify the physical object, as well as determine a position or state of the movable object of the physical object. In other words, the resonator's particular frequency may identify the physical object, and/or a change in the resonator's position corresponds to a change in position or state of the movable object. To name a couple of examples, the physical object may include a movable lever and/or a rotatable wheel or knob.

Figure 8A:
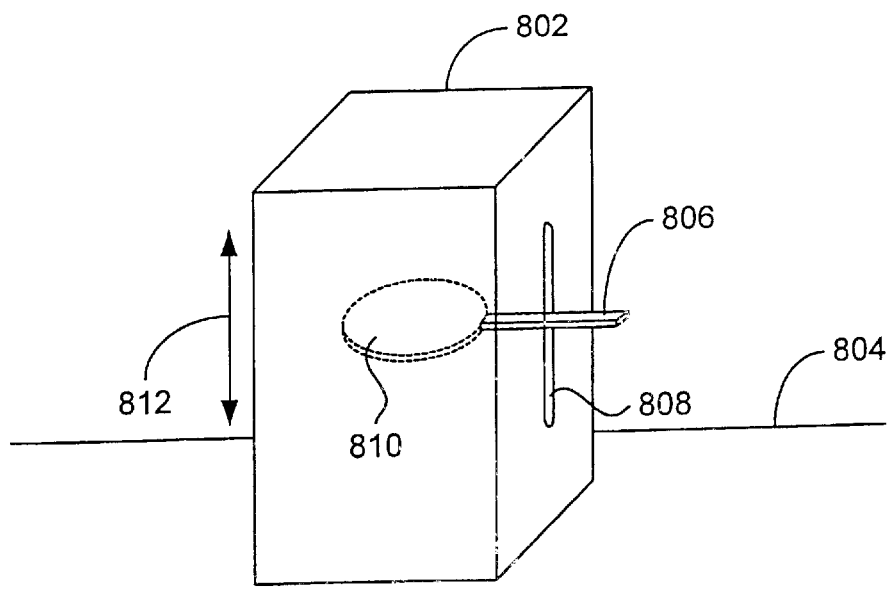
FIG. 8A is a diagrammatic perspective view of a physical object having a lever in accordance with one embodiment of the present invention.

FIG. 8A is a diagrammatic perspective view of a physical object 802 having a lever 806 in accordance with one embodiment of the present invention. As shown, the lever 806 is configured such that it may be moved up or down along direction 812 within slot 808. The lever 806 is coupled with a resonator 810 that also moves up and down with the lever 806. In other words, the lever 806 and resonator 810 are configured such that movement of the lever 806 results in a corresponding resonator 810 movement. Thus, the state of the physical's object's lever (e.g., up or down) may be determined by detecting a z position of the resonator 810 and translating the detected z position into an associated lever state (e.g., up, down, or somewhere in between). Note, the physical object should remain stationary with respect to the z axis so that the state of the lever 806 may be accurately determined. However, the physical object may be movable within other dimensions, such as the x and y directions, and the resonator may also be used to determine the other positions (e.g., x and y) of the physical object. Additionally, a frequency of the resonator 810 may be used to identify the physical object 802.

Figure 8B:
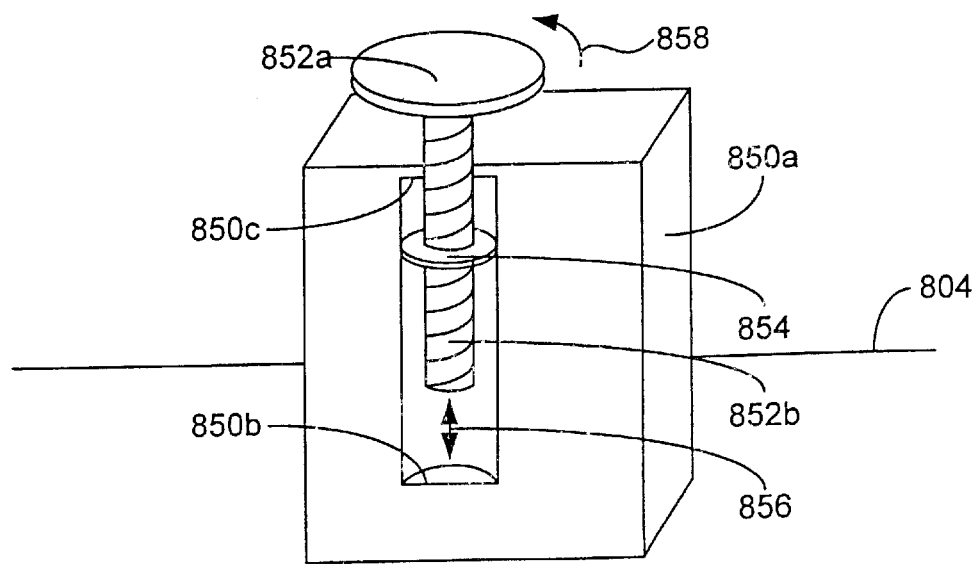
FIG. 8B is a diagrammatic perspective view of a physical object having a rotatable knob or screw in accordance with one embodiment of the present invention.

FIG. 8B is a diagrammatic perspective view of a physical object 850 having a rotatable knob or screw 852 in accordance with one embodiment of the present invention. As shown, the physical object 850 forms a cavity 850b for accepting the screw 852. The physical object 850 is configured to engage the screw 852 at screw hole 850c such that the screw may be screwed up and down within the cavity 850b. The screw 852 is also coupled with an associated resonator 854 such that when the screw moves up and down in directions 856 the resonator 854 also moves up and down in directions 856. For example, the resonator 854 has a hole for receiving the screw, and the resonator 854 is sized such that it slides along the cavity walls. Note, the physical object should remain stationary with respect to rotation 858 so that the state of the screw 825 may be accurately determined. However, the physical object may be movable within other dimensions, such as the x and y directions, and the resonator may also be used to determine the other positions (e.g., x and y) of the physical object. Additionally, a frequency of the resonator 854 may be used to identify the physical object 850.

In yet another embodiment, a physical object having a known configuration and two or more associated resonators are configured such that an orientation of the known configuration of the physical object may be determined based on the resonators' positions. For example, two or more resonators are placed within an physical object such that a topology and/or orientation of such topology of the physical object may be ascertained from the resonators' positions.

Figure 9A:
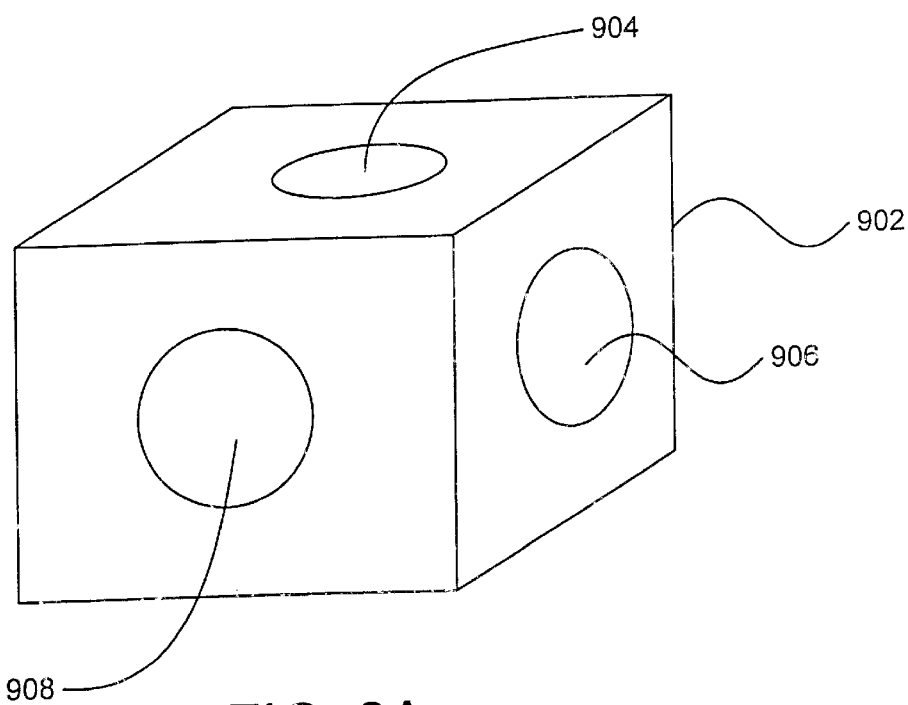
FIG. 9A is a perspective view of a six-sided die having three associated resonators for determining die position in accordance with one embodiment of the present invention.

FIG. 9A is a perspective view of a six-sided die 902 having three associated resonators (904, 906, and 908) for determining die position in accordance with one embodiment of the present invention. In this embodiment, each resonator 904, 906, and 908 has different frequency range. By determining which resonator is at a maximum or minimum z position, the die's orientation may then be determined. The following Table 1 summarizes the die's six possible positions and corresponding resonators positions:

TABLE 1

| Resonator Ref No. | Z Position | Die Position |
| --- | --- | --- |
| 904 | Min | 1 |
| 904 | Max | 4 |
| 906 | Min | 2 |
| 906 | Max | 5 |
| 908 | Min | 3 |
| 908 | Max | 6 |

Figure 9B:
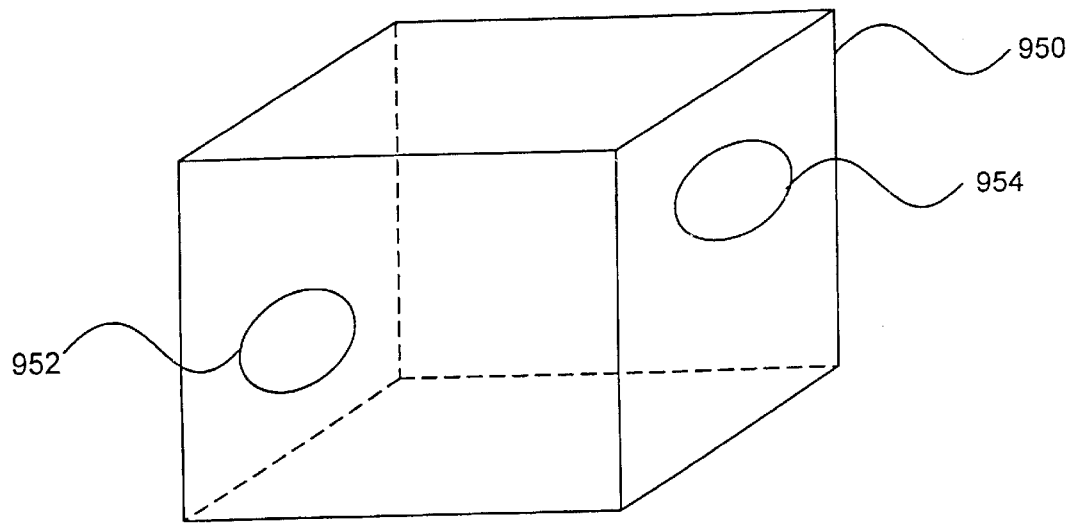
FIG. 9B is a perspective view of a six-sided die having two associated resonators for determining die position in accordance with one embodiment of the present invention.

FIG. 9B is a perspective view of a six-sided die 950 having two associated resonators 952 and 954 for determining die position in accordance with one embodiment of the present invention. As shown, the two resonators 952 and 954 are positioned on opposite sides of the die 950. Each resonator has a different x, y, and z position such that the six different positions of the die 950 may be distinguished by detecting the x, y, and z positions of the resonators 952 and 954.

Although the present invention has been described with a physical object in the form of a die, of course, the present invention may also be implemented with any three-dimensional object having any shape and/or configuration. That is, it should be well understood that three resonators that output x, y, and z position information may be used to determine an orientation (e.g., all positions of all points) of a three-dimensional object. Additionally, two resonators that output four degrees of freedom (e.g., x, y, z, rotation and/or tilt information) may be used such that the object's orientation may be determined by detecting the positions of the two resonators. In an alternative embodiment, one resonator may be used to determine the orientation of a three-dimensional object when the resonator outputs x, y, z, rotation, and tilt information.

In summary, many mechanisms for determining various physical object states are described above. These mechanisms allow a reduction in the number of resonators that are necessary for determining the physical object's identification (e.g., as illustrated in FIGS. 4, 5, and 6), movable object state (e.g., as illustrated in FIGS. 8A and 8B), and/or orientation (e.g., as illustrated in FIGS. 9A and 9B). Additionally, each resonator may be configured to allow determination of the states of more than one physical object, as illustrated in FIGS. 7A and 7B.

Further examples of mechanisms for translating various physical object states into one or more resonator positions are illustrated in FIGS. 10A through 17C. Although many different mechanisms may be used to implement the present invention, only a few exemplary mechanisms are described below in reference to FIGS. 10A through 17C and are not meant to limit the scope of the invention.

Figure 10A:
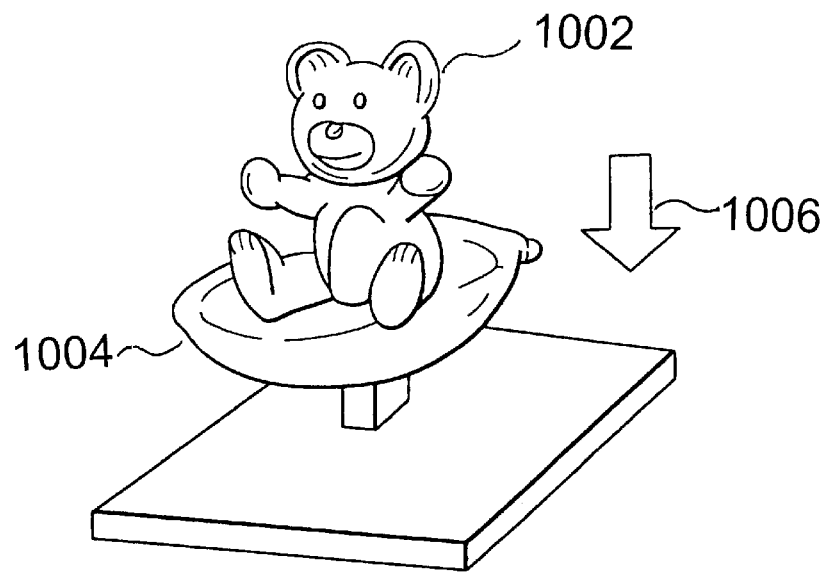
FIG. 10A represents a mechanism for detecting a weight of a physical object in accordance with one embodiment of the present invention.

As illustrated in FIG. 10A, one or more resonators may be configured to detect a weight of a physical object 1002 (as shown, a teddy bear). The physical object 1002 is placed on a scale 1004, which placement causes one or more resonators to correspondingly move in direction 1006, for example. In other words, the weight of the physical object results in a corresponding change in the associated resonator's position. The resonator position may then be detected and translated into a weight of the physical object. For example, a look-up table may include a plurality of weights and associated resonator positions, or a formula may be implemented to convert the resonator position into a weight value (e.g., $F=-kx$).

Figure 10B:
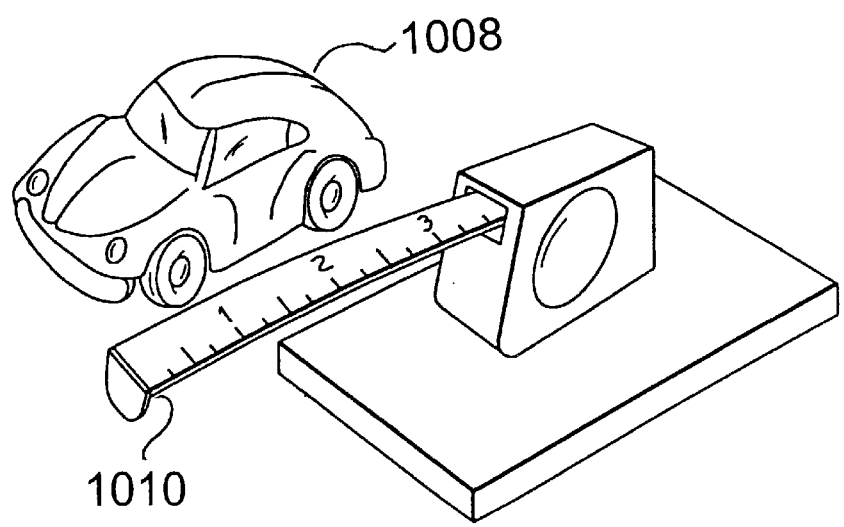
FIG. 10B represents a mechanism for measuring a length of a physical object in accordance with one embodiment of the present invention.

Similarly, FIG. 10B shows another measuring device 1010 (as shown, a tape measurer) that is used to measure a physical object 1008 (as shown, a car). As the physical object 1008 is measured (e.g., as the tape is pulled out), one or more associated resonators (not shown) move in a vertical direction, for example. Thus, the position of the resonator(s) may then be detected and translated into a measurement value for the physical object 1008.

Figure 11A:
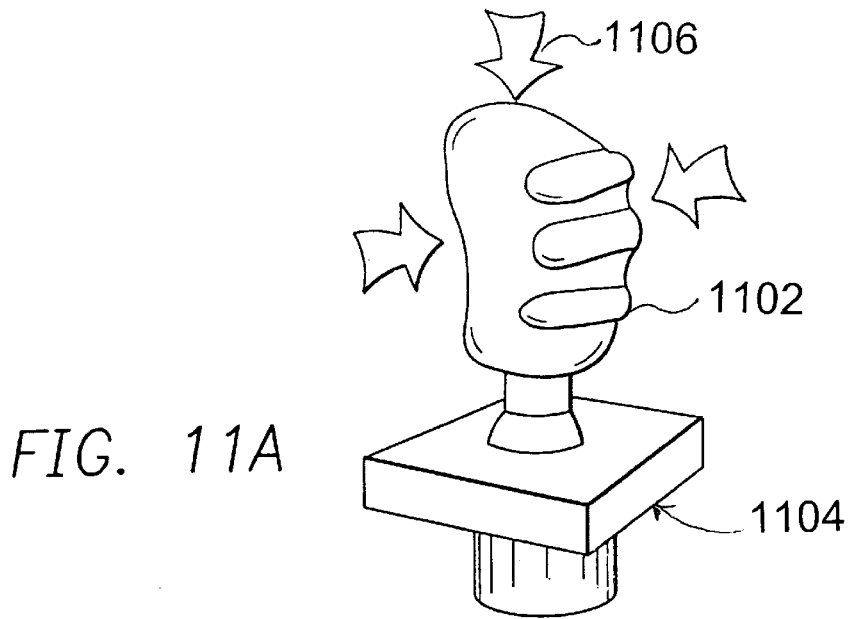
FIGS. 11A through 11C represent various mechanisms for detecting movement of various air-pumping physical objects in accordance with one embodiment of the present invention.
Figure 11B:
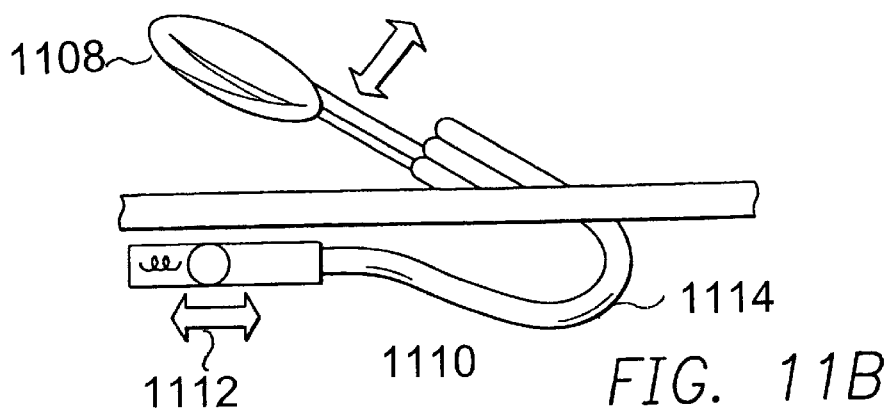
Figure 11C:
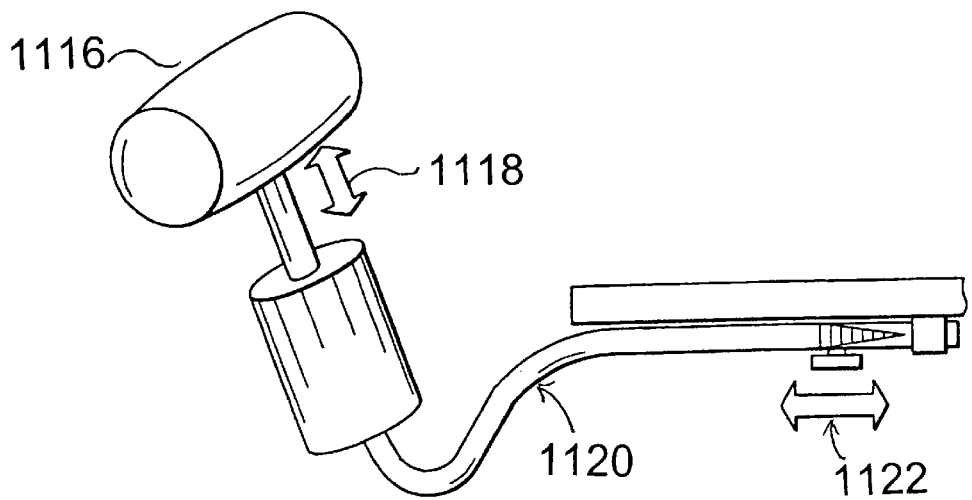

FIGS. 11A through 11C represent various air pumping mechanisms. For example, FIG. 11A shows a "pop-squeeze" type mechanism, wherein the user squeezes and moves a handle 1102. The handle 1102 is coupled with a diaphragm 1104 having a resonator that moves in a z direction 1106 with inflation or deflation of the diaphragm. Movement of the handle 1102 causes the diaphragm to inflate and the resonator to move. Thus, the handle movement may be tracked by detecting the movement of the resonator. Likewise, FIG. 11B shows a lever pumping mechanism, wherein pumping of a lever 1108 causes an associated resonator 1110 to move in an x direction 1112 within an air-filled tube 1114 that is connected to the lever 1108. FIG. 11C is another air-pump mechanism, wherein pumping of a handle 1116 in a z direction 1118 results in resonator movement 1122 within an air tube 1120. In sum, a pumping amount may be determined by tracking associated resonator positions.

Figure 12A:
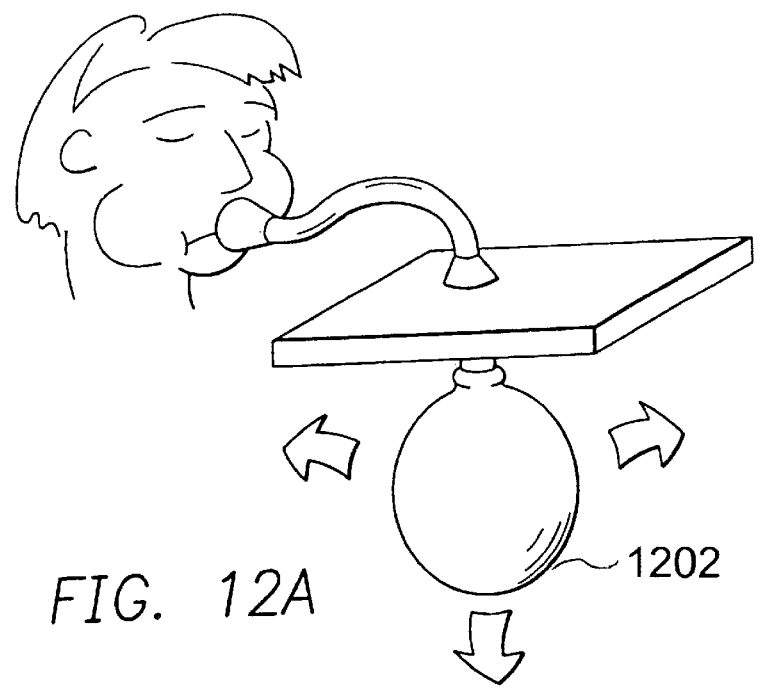
FIG. 12A represents a mechanism for detecting inflation and deflation of a balloon type physical object in accordance with one embodiment of the present invention.
Figure 12B:
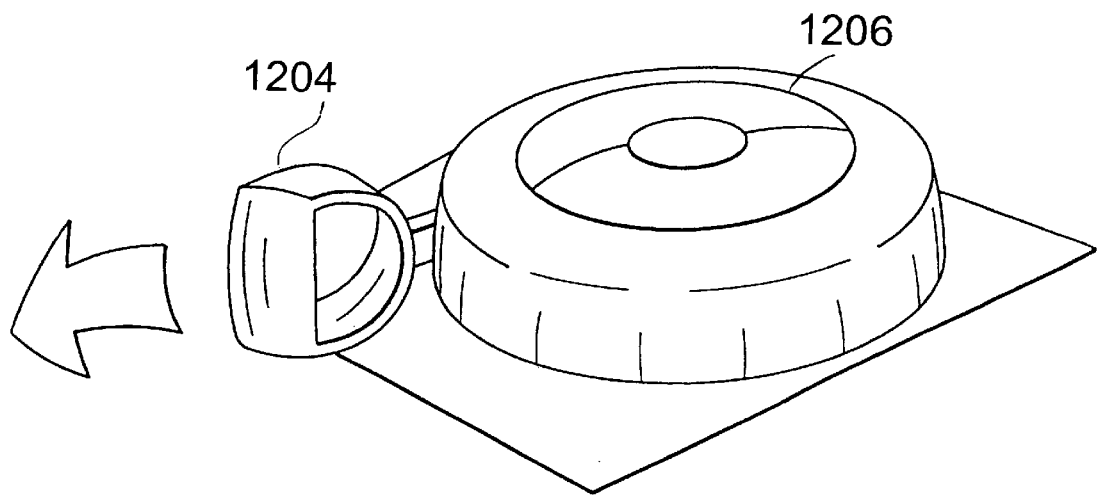
FIG. 12B shows a mechanism for detecting a state of a pull-cord type physical object in accordance with one embodiment of the present invention.

FIG. 12A represents a balloon mechanism, wherein a resonator (not shown) is located on a balloon 1202. When the balloon 1202 is inflated, the resonator position is altered and then detected, and the balloon radius or inflation amount may then be determined. FIG. 12B shows a pull-cord device 1204, wherein the cord 1206 is wrapped around a resonator (not shown) such that pulling the cord 1206 results in rotation of the resonator. Thus, the cord state (e.g., pulled out or retracted) may be determined by tracking the resonator position.

Figure 13:
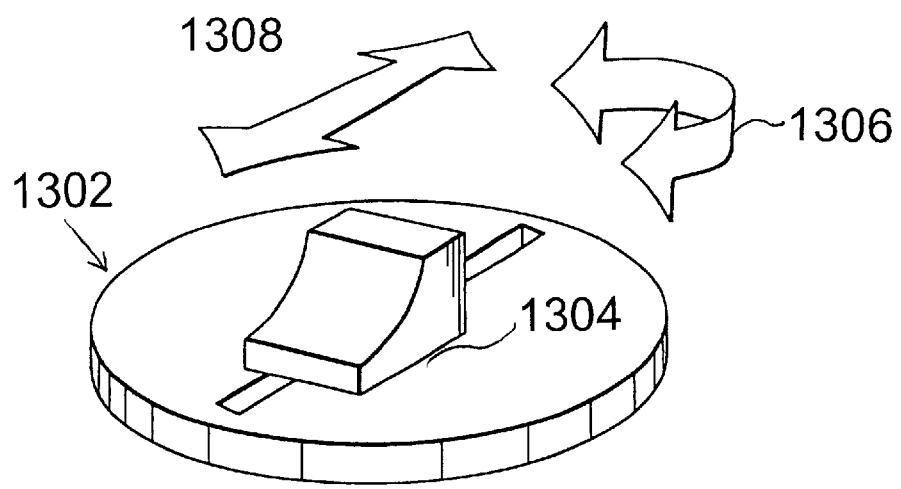
FIG. 13 represents a mechanism for detecting a slider state of a lever of a physical object and for detecting a rotation state of the physical object in accordance with one embodiment of the present invention.

FIG. 13 represents a physical object 1302 having a slider 1304 and is configured to be rotatable. In one embodiment, a resonator may be coupled to the slider 1304 such that the slider's state 1308 (e.g., slider position) may be detected as well as the physical object's rotation state 1306 by detecting a rotation and x and y positions of the resonator.

Figure 14:
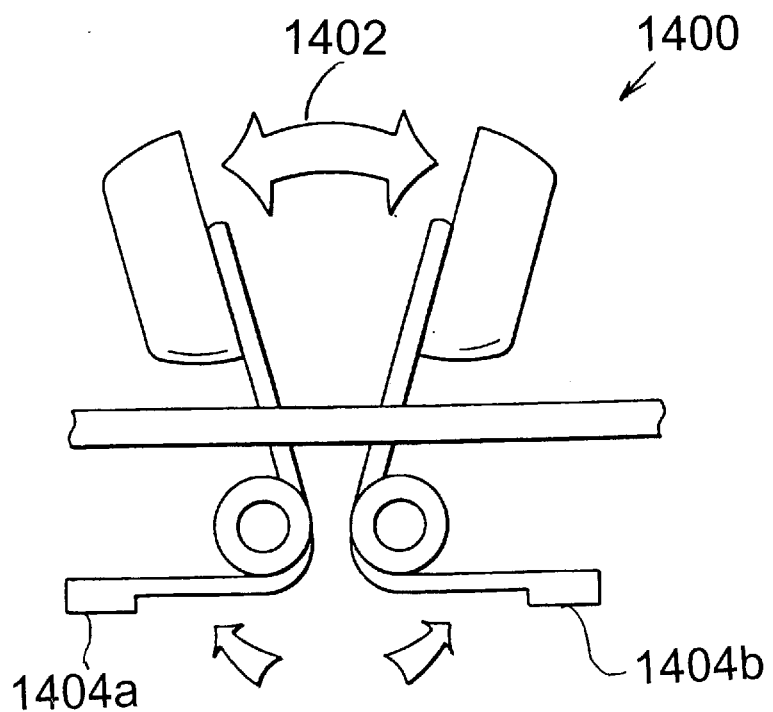
FIG. 14 illustrates a mechanism for detecting a state of a pair of levers that may be moved together and apart in accordance with one embodiment of the present invention.
Figure 15:
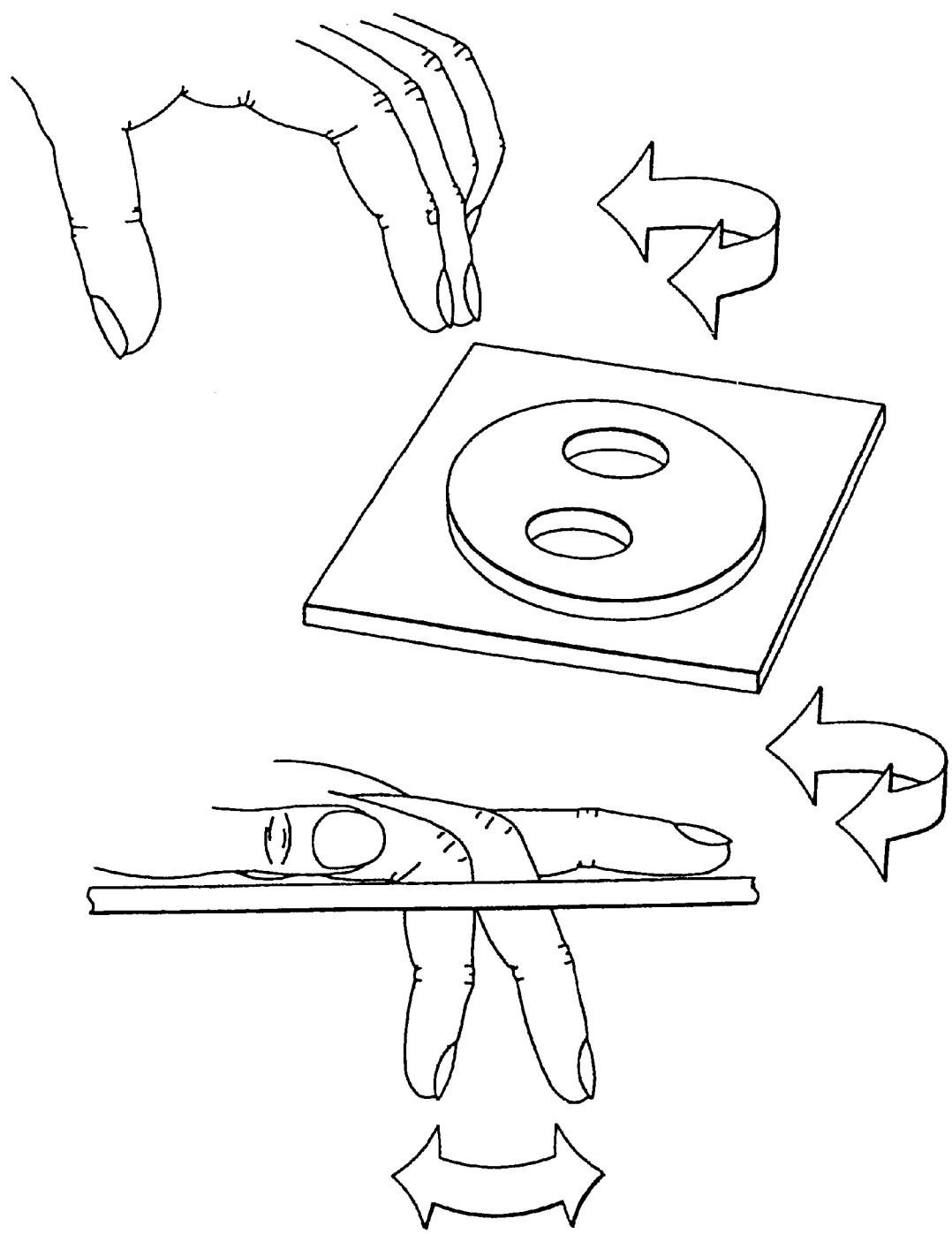
FIG. 15 shows a mechanism for detecting a user's "finger-walking" movement in accordance with one embodiment of the present invention.

FIG. 14 illustrates a pair of levers 1400 that may be moved together and apart in direction 1402. An associated resonator (e.g., 1404a and 1404b) is coupled to each lever 1400 such that a state of the levers (e.g., apart or together) may be determined by detecting the x positions of each resonator. FIG. 15 shows a "finger-walking" mechanism for detecting a walking motion of a user's fingers. A resonator is placed below the user's fingers, and when the user makes a walking motion, the resonator moves (e.g., rotates). Thus, the user's finger-walking movement may be tracked in time, for example, by detecting a rotation position of the resonator over a predetermined time period.

Figure 16A:
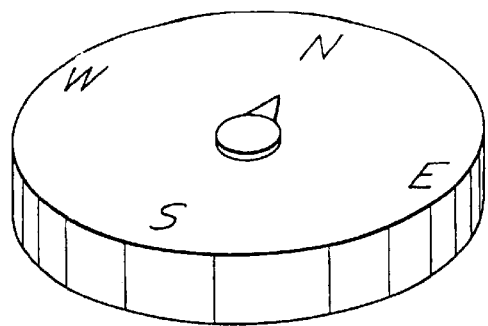
FIGS. 16A through 16C represent various rotary mechanisms for detecting a state of various types of physical objects in accordance with one embodiment of the present invention.
Figure 16B:
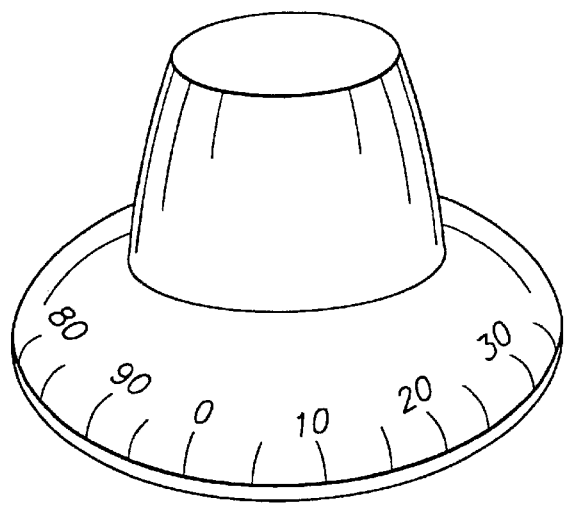
Figure 16C:
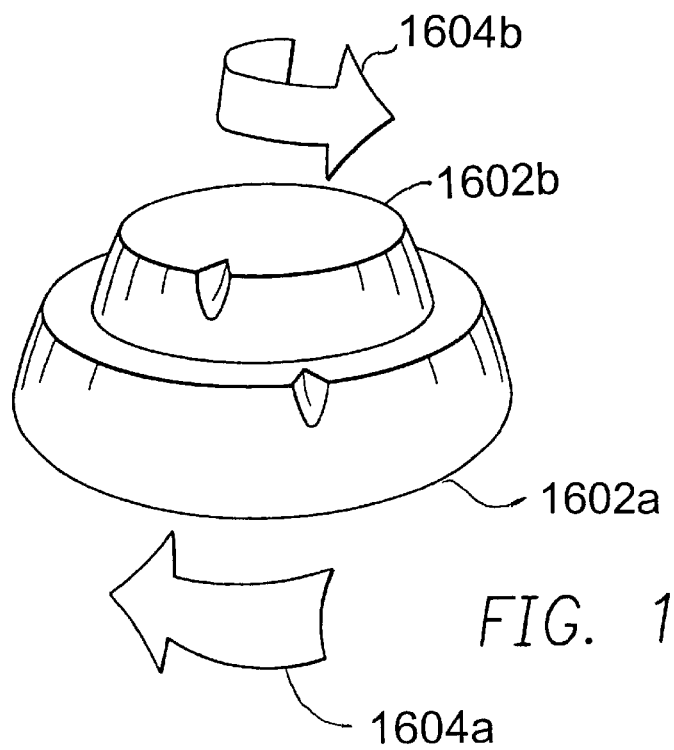

FIGS. 16A through 16C represent various rotary mechanisms for detecting a state of various types of physical objects. For example, FIG. 16A shows a compass device that is coupled with a resonator such that a compass direction may be determined by detecting the resonator's rotation. Likewise, FIG. 16B illustrates a combination type lock that is also coupled with a resonator. The resonator and lock are configured such that the turnings of the lock may be tracked by tracking the resonator's rotational positions. FIG. 16C illustrates a "dial-within-a-dial" mechanism having two concentric knobs 1602a and 1602b that are independently rotatable (e.g., 1604a and 1604b). Each knob is coupled with an associated resonator such that the knobs relative positions may be determined by detecting relative resonator rotation positions.

Figures 17A, 17B:
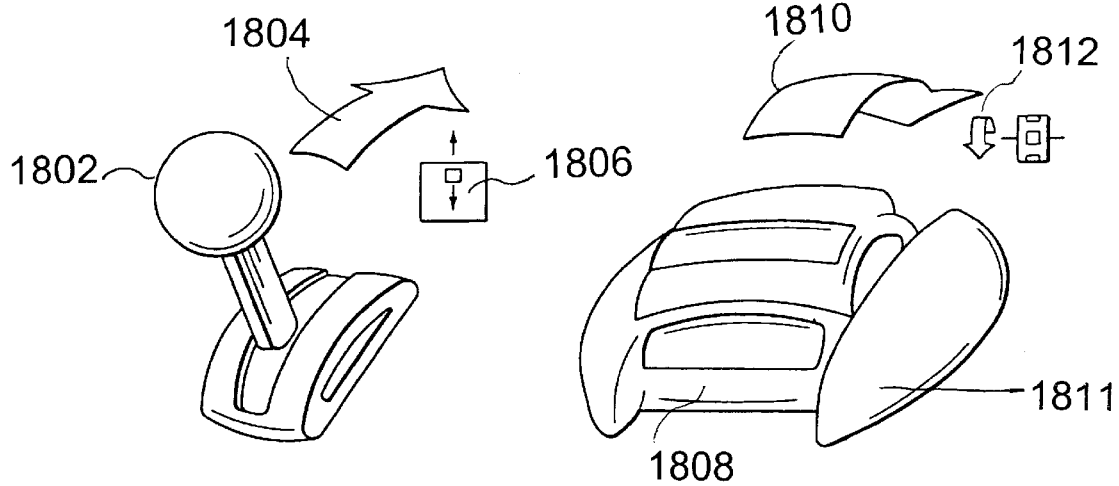
FIGS. 17A through 17C represent various mechanisms for detecting states of various handle type physical objects in accordance with one embodiment of the present invention.
Figure 17C:
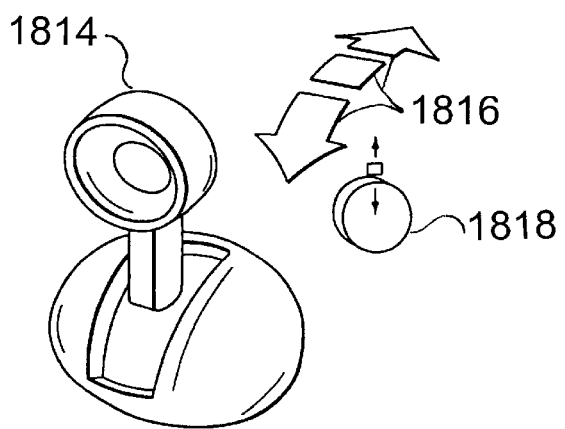

FIGS. 17A through 17C represent various handle type mechanisms, wherein the handle's position results in an associated resonator position change. FIG. 17A shows a shift type handle 1802 that rotates around a central axis. The shift type handle 1802 is coupled with a resonator that preferably moves in one direction 1806 (e.g., along FIGS. 17A through 17C represent various handle type mechanisms, wherein the handle's position results in an associated resonator position change. FIG. 17A shows a shift type handle 1802 that rotates around a central axis. The shift type handle 1802 is coupled with a resonator that preferably moves in one direction 1806 (e.g., along the z axis) in response to handle movement 1804. FIG. 17B shows a "barrel" type control wheel 1808 that rotates around a central axis 1811. The barrel control wheel 1808 is also linked to a resonator that correspondingly rotates in a direction 1812 in response to the barrel wheel rotational movement 1810. FIG. 17C illustrates a vertical jog shuttle, wherein when a handle 1814 is moved along a rotational path 1816, a resonator moves along a rotational path 1818. In the examples of FIGS. 17A through 17C, the handles states may be determined by detecting a position of the associated resonator.

Although the foregoing invention has been described in some detail for purposes of clarity of understanding, it will be apparent that certain changes and modifications may be practiced within the scope of the appended claims. For example, each resonator may also be configurable. The user may change the resonator frequency range. Each resonator may be configured with one or more variable capacitor(s) and/or one or more variable inductor(s). Thus, the user changes the capacitor and/or inductance value to affect a change in the resonator frequency values at which the resonator responds to an excitation signal and outputs a resonating frequency. Additionally, although the present invention is described as being implemented with electromagnetic sensing technology, any suitable sensing technology may be implemented, such as a camera based system. That is, the physical objects may include codes (e.g., bar codes) that are detected by the camera detection system. Mechanisms may then be provided for converting the detected codes into various physical object states, such as the physical object's identity. Accordingly, the present embodiments are to be considered as illustrative and not restrictive, and the invention is not to be limited to the details given herein, but may be modified within the scope and equivalents of the appended claims.

What is claimed is:

1. A position detection system for determining a state of a physical object, comprising:

a platform having an antenna that is arranged to output an excitation signal;

a physical object positioned adjacent to the platform, the physical object having an object state that is changeable;

a first resonator having a first resonator position state, wherein the first resonator position state is a position selected from the group consisting of an x position, a y position, a z position, a rotation position, and a tilt position, and the object state is an identifier of the physical object, the first resonator being arranged such that a change in the object state causes a change in the first resonator position state and such that the first resonator position state is different from the object state, the first resonator being further arranged to output a resonator signal that is associated with the first resonator position state when the excitation signal with a predetermined frequency range is received by the first resonator;

wherein the first resonator is mounted on a first spring that is attached to the platform, and when the physical object is engaged with the first resonator, the known shape of the physical object causes the first resonators to move one or more associated predetermined distances from their nonengaged position;

a translation mechanism for translating the object state into the first resonator position state; and a computer system arranged to output an excitation signal at the predetermined frequency range to the first resonator and receive the first resonator position state that is associated with the resonator signal that is output from the first resonator in response to the predetermined frequency range.

2. A position detection system as recited in claim 1, wherein the platform is interchangeable, and only the antenna of the platform is used to output the excitation signal.

3. A position detection system as recited in claim 2, wherein the platform includes a second resonator having a second resonator position state, the computer system being further arranged to receive the second resonator position state and determine a platform identity based on the second resonator position state.

4. A position detection system as recited in claim 1, wherein the computer system is further arranged to determine the object state by translating the first resonator position state into the object state.

5. A position detection system as recited in claim 1, wherein the object state is a position selected from the group consisting of an x position, a y position, a z position, a rotation position, and a tilt position and the first resonator position state is selected from another position selected from the group consisting of an x position, a y position, a z position, a rotation position, and a tilt position.

6. A position detection system as recited in claim 1 wherein the identifier is configured to form an orientation of a known shape of the physical object.

7. A position detection system as recited in claim 1 wherein the identifier is configured to form a known shape of the physical object.

8. A position detection system as recited in claim 1, wherein the predetermined distances form a code that may be used to identify the known shape of the physical object.

9. A position detection system as recited in claim 1 wherein the known shape of the physical object includes a cutaway portion that does not move the first resonator and a noncutaway portion that moves the second resonator.

10. A position detection system as recited in claim 1, wherein the first resonator is configurable such that the predetermined frequency range of the resonator signal is adjustable.

11. A position detection system for determining a state of a physical object, comprising:

a platform having an antenna that is arranged to output an excitation signal;

a physical object positioned adjacent to the platform, the physical object having an object state that is changeable;

a first resonator having a first resonator position state, the first resonator being arranged such that a change in the object state causes a change in the first resonator position state and such that the first resonator position state is different from the object state, the first resonator being further arranged to output a resonator signal that is associated with the first resonator position state when the excitation signal with a predetermined frequency range is received by the first resonator;

a translation mechanism for translating the object state into the first resonator position state; and a computer system arranged to output an excitation signal at the predetermined frequency range to the first resonator and receive the first resonator position state that is associated with the resonator signal that is output from the first resonator in response to the predetermined frequency range, wherein the object state is a measurement value and the measurement value is a weight value for the physical object and the translating mechanism is configured to form a scale that translates the weight value into the first resonator position state.

12. A position detection system for determining a state of a physical object, comprising:

a platform having an antenna that is arranged to output an excitation signal;

a physical object positioned adjacent to the platform, the physical object having an object state that is changeable;

a first resonator having a first resonator position state, the first resonator being arranged such that a change in the object state causes a change in the first resonator position state and such that the first resonator position state is different from the object state, the first resonator being further arranged to output a resonator signal that is associated with the first resonator position state when the excitation signal with a predetermined frequency range is received by the first resonator;

a translation mechanism for translating the object state into the first resonator position state; and a computer system arranged to output an excitation signal at the predetermined frequency range to the first resonator and receive the first resonator position state that is associated with the resonator signal that is output from the first resonator in response to the predetermined frequency range, wherein the physical object includes a movable object and the object state is a position of the movable object relative to the physical object, and wherein the movable object forms a lever and the object state is a z position of the lever and the first resonator position state is an x position of the resonator.

13. A position detection system as recited in claim 12, wherein the movable object forms a rotating screw and the object state is a rotation position of the screw and the first resonator position state is a z position of the resonator.

14. A position detection system for determining a state of a physical object, comprising:

a platform having an antenna that is arranged to output an excitation signal;

a physical object positioned adjacent to the platform, the physical object having an object state that is changeable;

a first resonator having a first resonator position state, the first resonator being arranged such that a change in the object state causes a change in the first resonator position state and such that the first resonator position state is different from the object state, the first resonator being further arranged to output a resonator signal that is associated with the first resonator position state when the excitation signal with a predetermined frequency range is received by the first resonator;

a translation mechanism for translating the object state into the first resonator position state; and a computer system arranged to output an excitation signal at the predetermined frequency range to the first resonator and receive the first resonator position state that is associated with the resonator signal that is output from the first resonator in response to the predetermined frequency range, wherein the first resonator position state includes a first degree of freedom and a second degree of freedom, the physical object includes a first object and a second object, the object state includes a first object position associated with the first object and a second object position associated with the second object, the first and second objects moving independently.

15. A position detection system as recited in claim 14, wherein the first degree of freedom is an x and a y position of the first resonator and the second degree of freedom is a rotation of the first resonator, the first object forms a door and the second object forms a knob, the first object position has an open or closed value and is translated by the translation mechanism into the first degree of freedom and the second object position has a rotation value that is translated by the translation mechanism into the second degree of freedom.

16. A method of determining the object state of a physical object within a position detection system, the position detection system also including a resonator having a resonator state that depends on the object state, the resonator state being different from the object state, the method comprising, sending an excitation signal with a frequency range to the resonator of the detection system;

receiving a position signal from the resonator, the position signal being based on the resonator state; and translating the position state associated with the received position signal into the object state, wherein the object state includes a measurement value of the physical object and the position state includes a position of the resonator and wherein the measurement value is a weight value for the physical object and the translating mechanism is configured to form a scale that translates the weight value into a first resonator position state.

17. A method as recited in claim 16, wherein the object state includes a first degree of freedom and the position state includes a second degree of freedom and the translating includes translating the second degree of freedom of the position state into the first degree of freedom of the object state.

18. A method as recited in claim 17, wherein the first degree of freedom is a z position and the second degree of freedom is selected from the group consisting of an x position, a y position, and a rotation position.

19. A method as recited in claim 16, wherein the object state includes an identifier of the physical object and the position state includes a position of the resonator.

20. A method as recited in claim 19, wherein the translating is accomplished by translating the position of the resonator with respect to the physical object into the identifier.

21. A method as recited in claim 16, wherein the object state includes a position of a movable object with respect to the physical object and the position state includes a position of the resonator.

22. A method as recited in claim 16, wherein the object state includes an orientation of a known shape of the physical object and the position state includes a position of the resonator.

23. A method as recited in claim 16, wherein the object state includes a first position of a first object of the physical object and a second position of a second object of the physical object and the position state includes a first degree of freedom of the resonator associated with the first position and a second degree of freedom associated with the second position.

* * * * *